(12) United States Patent
Shimizu et al.

(10) Patent No.: US 8,993,108 B2
(45) Date of Patent: Mar. 31, 2015

(54) MULTILAYER POLYIMIDE FILM, LAMINATE, AND METAL-CLAD LAMINATE

(75) Inventors: Masayoshi Shimizu, Otsu (JP); Hisayasu Kaneshiro, Uji (JP); Shogo Fujimoto, Otsu (JP)

(73) Assignee: Kaneka Corporation, Osaka (JP)

( * ) Notice: Subject to any disclaimer, the term of this patent is extended or adjusted under 35 U.S.C. 154(b) by 800 days.

(21) Appl. No.: 12/671,719

(22) PCT Filed: Jul. 18, 2008

(86) PCT No.: PCT/JP2008/063018
§ 371 (c)(1),
(2), (4) Date: Feb. 2, 2010

(87) PCT Pub. No.: WO2009/019968
PCT Pub. Date: Feb. 12, 2009

(65) Prior Publication Data
US 2011/0033682 A1   Feb. 10, 2011

(30) Foreign Application Priority Data
Aug. 3, 2007   (JP) .................................. 2007-203329

(51) Int. Cl.
| B32B 27/08 | (2006.01) |
| B32B 27/28 | (2006.01) |
| H05K 1/03 | (2006.01) |
| B32B 15/08 | (2006.01) |
| B32B 27/34 | (2006.01) |

(52) U.S. Cl.
CPC ............. *H05K 1/0346* (2013.01); *B32B 27/281* (2013.01); *B32B 15/08* (2013.01); *B32B 27/34* (2013.01); *H05K 1/036* (2013.01); *H05K 2201/0154* (2013.01); *H05K 2201/068* (2013.01)
USPC .......... 428/220; 428/212; 428/473.5; 428/457

(58) Field of Classification Search
CPC ...... B32B 15/04; B32B 15/088; B32B 27/34; H05K 1/0346; H05K 1/36
USPC ............................. 428/220, 212, 473.5, 457
See application file for complete search history.

(56) References Cited

U.S. PATENT DOCUMENTS

| 3,179,614 | A | 4/1965 | Edwards |
| 5,637,382 | A | 6/1997 | Kataoka et al. |
| 6,346,298 | B1 | 2/2002 | Takahashi et al. |
| 6,379,784 | B1 * | 4/2002 | Yamamoto et al. ............ 428/216 |
| 6,605,366 | B2 * | 8/2003 | Yamaguchi et al. ....... 428/473.5 |

FOREIGN PATENT DOCUMENTS

| CN | 1159151 C | 7/2004 |
| JP | 64-16832 | 1/1989 |
| JP | 2003-103738 | 4/2003 |
| JP | 2003-127275 | 5/2003 |
| JP | 2005-026542 | 1/2005 |
| JP | 2006-192800 | 7/2006 |
| JP | 2007-091803 | 4/2007 |

OTHER PUBLICATIONS

International Search Report for PCT/JP2008/063018, mailed Sep. 22, 2008.
English translation of the International preliminary report on patentability (Chapter 1) of PCT Application No. PCT/JP2008/063018.

* cited by examiner

*Primary Examiner* — Prashant J Khatri
(74) *Attorney, Agent, or Firm* — Nixon & Vanderhye, PC

(57) ABSTRACT

An object of this invention is to provide a polyimide film suitable for use in flexible printed circuit boards and the like which have high flexibility and dimensional stability, and to provide a laminate and metal-clad laminate which uses such a polyimide film. This invention relates to a multilayer polyimide film being a polyimide film having a multilayer structure, including: a core layer; and clad layers provided on each side of the film, which clad layers are exposed, the core layer being a non-thermoplastic polyimide having an average coefficient of linear expansion at a temperature from 100° C. to 200° C. in a range of 5 ppm/° C. to 20 ppm/° C., each of the clad layers being a polyimide having a peeling strength of 3 N/cm or less, the film as a whole having an average coefficient of linear expansion at a temperature range of 100° C. to 200° C. in a range of 9 ppm/° C. to 30 ppm/° C., and (a)>(b), where (a) is an average modulus of elasticity of the core layer and (b) is an average modulus of elasticity of the clad layers.

10 Claims, No Drawings

MULTILAYER POLYIMIDE FILM, LAMINATE, AND METAL-CLAD LAMINATE

This application is the U.S. national phase of International Application No. PCT/JP2008/063018, filed 18 Jul. 2008, which designated the U.S. and claims priority to Japanese Patent Application No. 2007-203329, filed 3 Aug. 2007 the entire contents of each of which are hereby incorporated by reference.

TECHNICAL FIELD

The present invention relates to a multilayer polyimide film, a laminate, and a metal-clad laminate, each of which is suitably used for flexible printed boards that are further required to have high flexibility and dimensional stability.

BACKGROUND ART

In recent years, electronic products have lighter weights, smaller sizes and higher densities. This has increased the demands for various printed boards. Among these printed boards, the demand for a flexible laminate (also referred to as a flexible printed circuit board (FPC) or the like) is particularly increasing. The flexible laminate has such a structure that a circuit constituted by a metal layer is provided on an insulating film such as a polyimide film.

Recent development of mobile phones and the like that are highly functioned and reduced in size has caused an increase in demand for an FPC having high flexibility and dimensional stability more than before. These properties are largely dependent on properties of a polyimide film that serves as a base of the FPC. One example of a conventional polyimide film is a polyimide film made from 4,4'-diaminodiphenylether (hereinafter also referred to as 4,4'-ODA) and pyromellitic dianhydride (hereinafter also referred to as PMDA). This conventional film has an average modulus of elasticity (hereinafter also referred to as modulus of elasticity) of about less than 4 GPa, and has a low stiffness value (i.e., has high flexibility), which stiffness value indicates film strength. However, an average coefficient of linear expansion (hereinafter also referred as coefficient of linear expansion) of the film exceeds 30 ppm, thereby giving the film insufficient dimensional stability (for example, see Patent Literature 1).

A technique to deal with this problem has been disclosed in which copolymerization is performed with a p-phenylenediamine for improving dimensional stability, thereby attaining a polyimide film that has a coefficient of linear expansion close to that of copper which is a metal mainly used (for example, see Patent Literature 2). However, if the coefficient of linear expansion is made close to that of copper, the modulus of elasticity increases in conflict, thereby causing the stiffness value to increase. This causes a problem of losing film flexibility.

As described above, there is a general tendency with the polyimide film that if the modulus of elasticity is low, the stiffness decreases and the coefficient of linear expansion increases. This causes the polyimide film to have poor dimensional stability. For such a reason, it is difficult to strike a balance between flexibility and dimensional stability.

On the other hand, as a typical method for reducing the stiffness value, a method which reduces thickness of the film is known. However, the method which reduces the film thickness has problems such as (i) the film can easily tear during its manufacture, thereby making it difficult to stably produce the film, and (ii) the insulating reliability of the film tends to decrease. Thus, the film thickness that is usable in the method is limited (e.g., see Patent Literature 3).

Therefore, the commercial market is longing for a polyimide film that has no limits in its film thickness, has high flexibility i.e. low stiffness value, and that has high dimensional stability.

Patent Literature 1
Japanese Patent Application Publication, Tokukousho, No. 36-10999 A
Patent Literature 2
Japanese Patent Application Publication, Tokukaihei, No. 1-16832 A
Patent Literature 3
Japanese Patent Application Publication, Tokukaihei, No. 8-156176 A

SUMMARY OF INVENTION

Technical Problem

The present invention is accomplished in view of the problems, and an object thereof is to provide (i) a polyimide film suitable for a flexible printed circuit board and the like, which polyimide film has high flexibility and dimensional stability, and (ii) a laminate and a metal-clad laminate, each of which uses such a polyimide film.

Solution to Problem

As a result of diligent study in view of the problems, the inventors of the present invention found that it is possible to attain a polyimide film having high flexibility and high dimensional stability by configuring the polyimide film as a laminated structure and controlling various properties such as the coefficient of elasticity and the coefficient of linear expansion of each layer of the multilayer structure. The present invention is accomplished based on this finding.

Namely, the present invention relates to a multilayer polyimide film being a polyimide film having a multilayer structure, including: a core layer; and clad layers provided on each side of the film, the clad layers being exposed, the core layer being a non-thermoplastic polyimide having an average coefficient of linear expansion at a temperature from 100° C. to 200° C. in a range of 5 ppm/° C. to 20 ppm/° C., each of the clad layers being a polyimide having a peeling strength of 3 N/cm or less, the film as a whole having an average coefficient of linear expansion at a temperature from 100° C. to 200° C. in a range of 9 ppm/° C. to 30 ppm/° C., and (a)>(b), where (a) is an average modulus of elasticity of the core layer and (b) is an average modulus of elasticity of the clad layers.

A preferred embodiment of the present invention relates to the multilayer polyimide film in which the average modulus of elasticity (a) of the core layer and the average modulus of elasticity (b) of the clad layers, each in the multilayer polyimide film, satisfy the following relational formulation (2): $0.9a \geq b \geq 0.3a$.

A preferred embodiment of the present invention relates to any one of the foregoing multilayer polyimide films in which each of the clad layers has a thickness component ratio of not less than 10% but not more than 50% with respect to the multilayer polyimide film as a whole.

A preferred embodiment of the present invention relates to any one of the foregoing multilayer polyimide films, in which the average modulus of elasticity (a) of the core layer in the multilayer polyimide film is not less than 4 GPa but not more than 7 GPa.

A preferred embodiment of the present invention relates to the multilayer polyimide film in which the film has an entire thickness in a range of 7 μm to 30 μm.

A preferred embodiment of the present invention relates to the multilayer polyimide film that is used as a base film of a cover lay or a metal-clad laminate.

The present invention relates to a laminate including: the multilayer polyimide film; and an adhesive layer provided on one or each side of the multilayer polyimide film.

The present invention relates to a metal-clad laminate including: the multilayer polyimide film; and a metal layer stacked on the multilayer polyimide film.

The present invention relates to a metal-clad laminate including: the laminate on which the adhesive layer is provided; and a metal layer stacked on the laminate.

The present invention relates to a multilayer polyimide film having a multilayer structure, including: a core layer; and clad layers provided on each side of the film, the clad layers being exposed, the polyimide film, after being shaved from surface layers on each side of the film by 25% of its entire thickness in a thickness direction, having an average coefficient of linear expansion at a temperature from 100° C. to 200° C. in a range of 5 ppm/° C. to 20 ppm/° C., each of the clad layers having a peeling strength of 3 N/cm or less, the film as a whole having an average coefficient of linear expansion at a temperature from 100° C. to 200° C. in a range of 9 ppm/° C. to 30 ppm/° C., and (a)>(b), where (a) is an average modulus of elasticity of the core layer and (b) is an average modulus of elasticity of the clad layers.

Advantageous Effects of Invention

The present invention allows providing a multilayer polyimide film that has high flexibility and excellent dimensional stability, and a laminate or a metal-clad laminate that uses such a multilayer polyimide film.

DESCRIPTION OF EMBODIMENTS

The following description explains one embodiment of the present invention.

A polyimide film in accordance with the present invention having a multilayer structure includes (i) a core layer and (ii) clad layers on each side of the film, which clad layers are exposed.

In the specification, the core layer denotes a layer around the middle and not an outermost layer of the polyimide film. For example, if the polyimide film is of a three-layer structure, then the middle layer (second layer) is the core layer; if the polyimide film is of a four-layer structure then the second or third layer or both second and third layers is(are) the core layer(s); if the polyimide film is of a five-layer structure then a middle layer of the second to fourth layers or one or more layers of the second to fourth layers is(are) the core layer(s). In the case of the five-layer structure, it is preferable to have the layer that is in the middle of the five layers to be the care layer. On the other hand, the clad layers are layers that cover a layer including the core layer, and denote each of layers that is exposed on an outer surface of the multilayer structure polyimide film.

The core layer of the polyimide film in accordance with the present invention is characterized by being a non-thermoplastic polyimide in which an average coefficient of linear expansion at a temperature from 100° C. to 200° C. is in a range of 5 ppm/° C. to 20 ppm/° C. In view of dimensional stability, an average coefficient of linear expansion of the core layer in the present invention is preferably in a range of 9 ppm/° C. to 20 ppm/° C., and more preferably in a range of 12 ppm/° C. to 18 ppm/° C.

The "average coefficient of linear expansion" in the present invention denotes an average of coefficients of thermal linear expansion measured at temperatures from 100° C. to 200° C. in directions of the film in a MD direction (Machine Direction), TD direction (Transverse Direction), molecular orientation axis direction, direction rotated 45° clockwise from the molecular orientation axis, and direction rotated 45° anticlockwise from the molecular orientation axis.

The coefficient of linear expansion of the polyimide film is measured by using a sample cut into a size having a width of 3 mm and a length of 10 mm, measured with for example a heat mechanical analysis apparatus manufactured by SII NanoTechnology Inc. having a product name of TMA/SS6100. First, the sample is heated from 0° C. to 460° C. in a tensioned mode having a load of 29.4 mN. Then, the sample is cooled to 10° C., and is again heated at a heating rate of 10° C. per minute. The average coefficient of linear expansion is worked out by averaging the coefficients of linear expansion between 100° C. to 200° C. during the second heating. In a case of measuring a coefficient of linear expansion of the core layer, for example the clad layers may be shaved off from the multilayer polyimide film so as to measure the remaining core layer, or the core layer may be prepared as a single layer, and a coefficient of linear expansion of the single layer core layer may be measured.

The non-thermoplastic polyimide in the present invention generally denotes a polyimide that does not soften or become adhesive at application of heat. In the present invention, the non-thermoplastic polyimide denotes a polyimide which can keep its shape without being wrinkled or stretched, even after the non-thermoplastic polyimide is heated in the form of the film at 380° C. for 2 minutes, or alternatively, denotes a polyimide that has substantially no glass transition temperature. The glass transition temperature is worked out from a point of inflection of a storage modulus measured by a dynamic viscoelasticity measurement apparatus (DMA). Moreover, "has substantially no glass transition temperature" denotes that the film starts to pyrolyze before the film transits to a glass transition state.

A feature of the multilayer polyimide film in accordance with the present invention is that the average modulus of elasticity (a) of the core layer and the average modulus of elasticity (b) of the clad layers satisfy the following relational formulation (1): a>b. If the modulus of elasticity (b) of the clad layers is equal to or more than the modulus of elasticity (a) of the core layer, the stiffness value of an entire film increases, thereby causing loss in flexibility. Therefore, this is not preferable. In view of dimensional stability and flexibility, the average modulus of elasticity of the core layer is preferably in a range of 4 GPa to 7 GPa, and more preferably in a range of 4 GPa to 6 GPa.

The average modulus of elasticity in the present invention denotes an average of moduli of elasticity measured based on ASTM D-882 in directions of the film in a MD direction (Machine Direction), TD direction (Transverse Direction), molecular orientation axis direction, direction rotated 45° clockwise from the molecular orientation axis, and direction rotated 45' anticlockwise from the molecular orientation axis. For example, the average modulus of elasticity of the core layer may be measured by shaving off the clad layers from the multilayer polyimide film to measure the remaining core layer, or the core layer may be prepared as a single layer, and the average modulus of elasticity of the single layer core layer may be measured.

Each of the clad layers of the multilayer polyimide film in accordance with the present invention is characterized by being a polyimide having a peeling strength of not more than 3 N/cm. The "peeling strength" in the present invention denotes an adhesion strength worked out by the following method: (i) a copper foil (BHY-22BT) manufactured by Japan Energy Corporation having a thickness of 18 μm is provided on (a) both sides of the multilayer polyimide film itself or on (b) both sides of a polyimide film formed as a 12.5 μm-thick single layer film from a polyamic acid solution from which the clad layer is made, (ii) the copper foil and the polyimide film are thermally compressed together at a laminating temperature of 380° C., laminating pressure of 0.8 t, and line speed of 1 m/min, so as to prepare a sample according to JIS C6471 "6.5 Peeling Strength", and (iii) a load for peeling the metal foil part having a width of 5 mm with a peeling angle of 180 degrees at a peeling rate of 50 mm/min is measured. The peeling strength has an upper limit of preferably not more than 3 N/cm, and is further preferably not more than 1.5 N/cm, for example, in view of a conveying property during thermal processing such as a case where (i) two or more of the films are laminated together and conveyed under heat application or (ii) the film is laminated with another film and conveyed under heat application. On the other hand, the peeling strength has a lower limit of preferably 0 N/cm in view of the conveying property during the thermal processing. However, the lower limit is not particularly limited in value.

For instance, Japanese Patent No. 3976532 and Japanese Patent Application Publication No. 2007-91803 A are known as polyimide films having a multilayer structure, however these multilayer polyimide films are polyimide films for forming a polymer optical waveguide or are adhesive films. Thus, these films should have an outermost layer having a high coefficient of linear expansion of not less than 50 ppm/° C. or high adhesiveness. In other words, the coefficient of linear expansion of an entire multilayer film is much higher than 30 ppm/° C., or the peeling strength of the clad layer is much higher than 3 N/cm. These films are designed for a completely different object to what the present invention intends, and relates to a completely different technical field of films.

In the present invention, the modulus of elasticity (b) of the clad layer in the multilayer polyimide film is not limited as long as the relational formulation of a>b is satisfied with respect to the modulus of elasticity (a) of the core layer. However, in view of flexibility and dimensional stability, it is more preferable that the relational formulation (2): $0.9a \geq b \geq 0.3a$ is satisfied, and is further preferable to satisfy $0.7a \geq b \geq 0.4a$.

The coefficient of linear expansion of the entire multilayer polyimide film in accordance with the present invention, in view of dimensional stability, is preferably in a range of 9 ppm/° C. to 30 ppm/° C., and is further preferably in a range of 12 ppm/° C. to 25 ppm/° C. The coefficient of linear expansion of the multilayer polyimide film is preferably close to a coefficient of linear expansion of a metal thus used. A coefficient of linear expansion that is not within the foregoing range causes dimensional change rates to differ between the metal and the film during the thermal processing; therefore, such a coefficient of linear expansion is not preferable.

The modulus of elasticity of the entire multilayer polyimide film is set by appropriately setting the modulus of elasticity of the core layer and clad layer as described above. However, the modulus of elasticity of the entire multilayer polyimide film is preferably set in a range of 3 GPa to 6 GPa.

A thickness of the entire multilayer polyimide film is not particularly limited, however is preferably in a range of 7 μm to 30 μm and is further preferably in a range of 10 μm to 25 μm. This is because a thin film tends to be demanded for use in cover lays or metal-clad laminates.

A thickness component ratio of the clad layers (a total thickness component ratio of the clad layers on both sides) in the multilayer polyimide film of the present invention depends on a coefficient of linear expansion and modulus of elasticity of the designed multilayer film, and also a composition of the polyimide resin thus used. However, in view of dimensional stability and flexibility, the ratio is on the whole preferably not less than 10% but not more than 50%, and is further preferably not less than 10% but not more than 40%.

One aspect of the multilayer polyimide film of the present invention is a multilayer polyimide film having a multilayer structure, including a core layer; and clad layers provided on a surface of the film, which clad layers are exposed, the polyimide film, after being shaved from surface layers on each side of the film by 25% of its entire thickness in a thickness direction, having an average coefficient of linear expansion at a temperature from 100° C. to 200° C. in a range of 5 ppm/° C. to 20 ppm/° C., the clad layer having a peeling strength of 3 N/cm or less, the film as a whole having an average coefficient of linear expansion at a temperature from 100° C. to 200 in a range of 9 ppm/° C. to 30 ppm/° C., and (a)>(b), where (a) is an average modulus of elasticity of the core layer and (b) is an average modulus of elasticity of the clad layers.

The "the polyimide film, after being shaved from surface layers on each side of the film by 25% of its entire thickness in a thickness direction" substantially corresponds to a whole or part of a film that includes the foregoing core layer. This polyimide film can be obtained by shaving off 25% of the entire thickness from an upper surface of the film by appropriately using a file or the like under a stereomicroscope, then further shaving off 25% of the entire thickness from a lower surface of the film. Various properties of the clad layer and the entire film in the multilayer film are identical to the foregoing description.

The following description explains a method for manufacturing the multilayer polyimide film of the present invention. The multilayer polyimide film in accordance with the present invention can be usually manufactured by using a polyamide acid as its precursor. Any well known method for preparing a polyamide acid may be used to prepare the polyamide acid. Usually, an aromatic dianhydride and an aromatic diamine, substantially in equimolar amounts at least finally, are dissolved and reacted in an organic solvent, so as to obtain a polyamide acid organic solvent solution. A polymerization method in polymerization of the polyamide acid is characterized by its order of adding monomers. By controlling the monomer type, order of addition and the like, various properties of the polyimide film are controllable.

In the present invention, any method for adding the monomer may be used in the polymerization of the polyamide acid. The following are examples of typical polymerization methods that may be used:

(1) a method in which polymerization is carried out by dissolving an aromatic diamine in an organic polar solvent, then reacting this mixture with a substantially equimolar aromatic tetracarboxylic acid dianhydride;

(2) a method in which: a prepolymer having an acid anhydride group on both its terminals is prepared by reacting an aromatic tetracarboxylic acid dianhydride with an aromatic diamine compound in an organic polar solvent, which the aromatic diamine compound has much fewer mols than the aromatic tetracarboxylic acid dianhydride, and thereafter polymerization is carried out with the aromatic diamine compound so that the aromatic tetracarboxylic acid dianhydride and the aromatic diamine compound are substantially equimolar over all steps of the polymerization;

(3) a method in which: (i) a prepolymer having an amino group on both its terminals is prepared by reacting an aromatic tetracarboxylic acid dianhydride and an aromatic diamine compound in an organic polar solvent, which the aromatic diamine compound has excess molar quantity than the aromatic tetracarboxylic acid dianhydride, (ii) the aromatic diamine compound is further added to the prepolymer, then (iii) polymerization is carried out with the aromatic tetracarboxylic acid dianhydride so that the aromatic tetracarboxylic acid dianhydride and the aromatic diamine compound are substantially equimolar over all steps of the polymerization;

(4) a method in which an aromatic tetracarboxylic acid dianhydride is dissolved and/or dispersed in an organic polar solvent, and thereafter polymerization is carried out with an aromatic diamine compound so that the aromatic diamine compound becomes equimolar to the aromatic tetracarboxylic acid dianhydride; and (5) a method in which polymerization is carried out by reacting a mixture of an aromatic tetracarboxylic acid dianhydride and aromatic diamine in substantially equimolar amounts, in an organic polar solvent. These methods may be carried out solely, or may be carried out in combination by parts.

A suitable acid dianhydride usable in the present invention is not particularly limited, and examples thereof encompass: pyromellitic dianhydride, 2,3,6,7-naphthalene tetracarboxylic acid dianhydride, 3,3',4,4'-biphenyl tetracarboxylic acid dianhydride, 1,2,5,6-naphthalene tetracarboxylic acid dianhydride, 2,2',3,3'-biphenyl tetracarboxylic acid dianhydride, 3,3',4,4'-benzophenone tetracarboxylic acid dianhydride, 2,2-bis(3,4-dicarboxyphenyl)propane dianhydride, 3,4,9,10-perylene tetracarboxylic acid dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic acid dianhydride, bis(3,4-dicarboxyphenyl) sulfone dianhydride, p-phenylene bis(trimellitic monoester acid anhydride), ethylene bis(trimellitic monoester acid anhydride), bisphenol A bis(trimellitic monoester acid anhydride), and their derivatives. These may be suitably used solely, or may be used in combination as a mixture mixed at an arbitrary proportion.

A suitable diamine usable in the present invention is not particularly limited, and examples thereof encompass: 4,4'-oxydianiline, p-phenylene diamine, 4,4'-diaminodiphenyl propane, 4,4'-diaminodiphenyl methane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diaminodiphenylether, 3,3'-diaminodiphenylether, 3,4'-diaminodiphenylether, 1,5-diaminonaphthalene, 4,4'-diaminodiphenyldiethylsilane, 4,4'-diaminodiphenyl silane, 4,4'-diaminodiphenylethyl phosphine oxide, 4,4'-diaminodiphenyl N-methylamine, 4,4'-diaminodiphenyl N-phenylamine, 1,4-diaminobenzene (p-phenylene diamine), 1,3-diaminobenzene, 1,2-diaminobenzene, 2,2-bis(4-(4-aminophenoxy)phenyl)propane, and their derivatives. These may be suitably used solely, or may be used in combination as a mixture mixed according to an arbitrary proportion.

These diamines and acid dianhydrides may be combined together as appropriate to perform a molecular design, to be able to obtain a polyimide having a desired property.

There is no perfect rule in the molecular design; the molecular is to be designed within a range of common knowledge of a person skilled in the art in consideration of the following general tendencies:

(I) if a monomer having a rigid structure such as phenylene diamines, benzidines, a pyromellitic dianhydride or the like is used, the modulus of elasticity tends to increase, and the coefficient of linear expansion tends to decrease;

(II) if a monomer having a flexible group (e.g., ether bond, hydrocarbon group, sulfone group, or carbonyl group) in a molecular chain is used, the modulus of elasticity tends to decrease and the coefficient of linear expansion tends to increase; and (III) if a monomer that is not straight-chained as a whole such as 3,3',4,4'-biphenyl tetracarboxylic acid dianhydride is used, the same tendency is observed as with (II).

A preferable solvent used for synthesizing the polyamide acid in the present invention may be any solvent as long as a polyamide acid is dissolvable therein, and examples thereof encompass amido-based solvents, such as N,N-dimethylformamide, N,N-dimethylacetamide, and N-methyl-2-pyrrolidone. Among the amido-based solvents, N,N-dimethylformamide or N,N-dimethylacetamide is preferably used in particular.

Moreover, a filler may be added for improving the film in a property such as sliding property, thermal conductivity, electrical conductivity, and/or corona resistance. The filler is not particularly limited, and preferable examples encompass: silica, titanium oxide, alumina, silicon nitride, boron nitride, calcium hydrogenphosphate, calcium phosphate, and mica.

A particle size of the filler is determined based on (i) a film property that is to be modified and (ii) a type of the filler thus added, and therefore is not particularly limited. However, it is generally preferable to use a filler having an average particle size in a range of 0.05 µm to 100 µm, preferably in a range of 0.1 µm to 75 µm, further preferably in a range of 0.1 µm to 50 µm, and particularly in a range of 0.1 µm to 25 µm. If the particle size is smaller than this range, the modification effect is not so effective apparently, and if the particle size exceeds this range, surface property may remarkably deteriorate or mechanical properties may remarkably decrease. Moreover, the filler is also not particularly limited in terms of its amount, since the amount is also determined based on (i) the film property that is to be modified and (ii) the filler particle size. Generally, the added amount of filler is in a range of 0.01 parts to 100 parts by weight, preferably in a range of 0.01 parts to 90 parts by weight, and further preferably in a range of 0.02 parts to 80 parts by weight, each with respect to 100 parts by weight of the polyimide. If the added amount of filler is smaller than this range, the filler modification effect is less effective apparently, and if the added amount exceeds this range, mechanical properties of the film may remarkably deteriorate.

Any method may be used for adding the filler. The following are some examples that may be used:

(1) the filler is added to a polymerization reaction fluid before or during polymerization;

(2) after termination of the polymerization, the filler is kneaded in by using a three roll mill or the like;

(3) a fluid dispersion containing the filler is prepared, and this fluid dispersion is mixed to the polyamide acid organic solvent solution; and (4) dispersion is carried out by a beads mill or the like. It is preferable to use the method in which a fluid dispersion containing the filler is prepared and the fluid dispersion is mixed to the polyamide acid organic solvent solution, particularly mixing the fluid dispersion and the polyamide acid organic solvent solution immediately before formation of the film, since this method causes the least contamination by the filler in the manufacturing line.

In preparing the fluid dispersion containing the filler, it is preferable to use a same solvent as the polymerization solvent of the polyamide acid. Moreover, a dispersing agent, a thickening agent or the like may be used within a range which gives no influence on film properties, for suitably dispersing the filler and to stabilize the dispersed state.

If the filler is added for improving sliding properties of the film, a particle size of the filler is to be in a range of 0.1 μm to 10 μm, and is preferably in a range of 0.1 μm to 5 μm. If the particle size is smaller than this range, the sliding property is not improved apparently, and if the particle size exceeds this range, an ultrafine wiring pattern becomes difficult to create. Moreover, in this case, the dispersed state of the filler is also important, and it is preferable to have a filler aggregate of a size not less than 20 μm dispersed to include not more than 50 aggregates per square meter, more preferably dispersed to include not more than 40 aggregates per square meter. If the amount of the filler aggregate of a size of not less than 20 μm exceeds this range, this may become a cause of cis sing of an adhesive agent applied to the film, and may cause a decrease in adhesive area in creating an ultrafine pattern on the film, thereby causing a decrease in insulating reliability of the flexible printed board itself.

One typical example of a method for manufacturing a multilayer polyimide film in accordance with the present invention is, for example, a method including the following steps:
(a) a step (polyamide acid polymerization step) of polymerizing a polyamide acid (polyamic acid) which is a precursor of a polyimide resin;
(b) a step (liquid film forming step) of forming a liquid film by casting the obtained polyamide acid as an organic solvent solution on a supporting body;
(c) a step (gel film forming step) of converting the liquid film to a gel film;
(d) a step (baking step) of heating the gel film so as to imidize (bake) the gel film;
(e) a step (application step) of applying a polyamide acid solution on the obtained polyimide film;
(f) a step (drying step) of drying the applied film; and
(g) a step (imidization step) of imidizing a multilayer film thus dried.

Another method which may be used is a method in which two or more types of polyamide acid solutions obtained in step (a) are simultaneously extruded from respective T dies of different flow channels, so as to form a multilayer polyimide film from the two or more types of extruded polyamide acid solutions by following the steps (b) through (d) for the two or more types of extruded polyamide acid solutions at once. This method includes fewer numbers of steps than the manufacturing method that includes the application step, and therefore is more preferable in view of cost.

The following description explains the step (b) and subsequent steps.

<Liquid Film Forming Step>

In the liquid film forming step, a liquid film is formed by first preparing an organic solvent solution of a polyamide acid (for convenience, is referred to as polyamide acid solution) by using the polyamide acid obtained in the polyamide acid polymerization step or a polyamide acid or the like that is already synthesized, and thereafter casting this polyamide acid solution on a supporting body to form a liquid film. The polyamide acid solution thus prepared preferably includes a curing agent. Therefore, the polyamide acid solution thus prepared in the present step may be a film-forming dope into which a curing agent is added in advance.

Generally, the following two methods for imidizing a polyamide acid are most well known: a thermal imidization method carried out just by use of heat (also called a thermal curing method); and a chemical imidization method with use of a curing agent (also called a chemical curing method). Although either of the two methods is applicable, it is preferable to apply the chemical curing method in view of attaining further high productivity.

The curing agent includes at least a chemical dehydrating agent, and more preferably includes a chemical dehydrating agent and catalyst. The chemical dehydrating agent is not particularly limited as long as the chemical dehydrating agent is an agent which dehydrates and ring-closes the polyamide acid. Specific preferable examples of a main component of the chemical dehydrating agent encompass: aliphatic acid anhydrides, aromatic acid anhydrides, N,N'-dialkylcarbodiimide, lower aliphatic halogen compounds, halogenated lower aliphatic acid anhydrides, aryl sulfonic acid halides, thionyl halides, or a mixture of two or more of these compounds. Among these compounds, the aliphatic acid anhydrides and aromatic acid anhydrides are suitably used in particular.

Moreover, the catalyst is not particularly limited as long as the catalyst is a component which accelerates the dehydrating and ring-closing effect of the chemical dehydrating agent on the polyamide acid. More specifically, the following catalysts may be used for example: aliphatic tertiary amines, aromatic tertiary amines, or heterocyclic tertiary amines. Among these compounds, it is particularly preferable to use nitrogen-contained heterocyclic compounds such as imidazole, benzimidazole, isoquinoline, quinoline, and β-picoline.

Amounts used of the chemical dehydrating agent and catalyst are not particularly limited as long as imidization is possible to a desired degree. However, it is preferable that the chemical dehydrating agent is used in a range of 0.5 mol to 5 mol, and is more preferable to be in a range of 1.0 mol to 4 mol, each with respect to 1 mol of an auric acid unit in the polyamide acid contained in the polyamide acid solution to which the chemical dehydrating agent is added. Moreover, it is preferable that the catalyst is used in a range of 0.05 mol to 3 mol, and is more preferable to be in a range of 0.2 mol to 2 mol, each with respect to 1 mol of the amic acid unit in the polyamide acid contained in the polyamide acid solution to which the chemical dehydrating agent and catalyst are added. If the amounts of the chemical dehydrating agent and catalyst used are lesser than this range, the chemical imidization becomes insufficient, thereby causing (i) breakage during the imidization (baking), (ii) decrease in mechanical strength, and (iii) the like. Moreover, if the amounts used of the chemical dehydrating agent and catalyst exceed the foregoing range, the imidization proceeds too fast, thereby making it difficult to cast the polyamide acid solution into a film form.

The organic solvent used in preparation of the polyamide acid solution and curing agent is not particularly limited. An organic solvent suitable for formation of a liquid film, or formation, baking or the like of a gel film in a latter stage is selected and used as appropriate, provided that the organic solvent gives no effect on properties of the polyamide acid or the polyimide. More specifically, an organic polar solvent exemplified as the polymerization solvent in the polymerization of the polyamide acid is one example of the organic solvent. By using such an organic polar solvent, the polymerization solvent solution of the polyamide acid as obtained in the polyamide acid polymerization step may be used as the polyamide acid solution.

Moreover, the properties of the polyamide acid solution are not particularly limited. For example, a solid content concentration and viscosity of the polyamide acid in the polyamide acid solution may be set to a range suitable for liquid film formation, gel film formation or the like, as appropriate.

The supporting body for casting the polyamide acid solution is not particularly limited, as long as the supporting body does not melt or degenerate due to the polyamide acid solution, and has a thermal resistance that can resist a heating processing carried out for removing the organic solvent from the polyamide acid solution. More specifically, for example, a rotatable supporting body such as an endless belt or drum that can continuously form a gel film by surface rotation and convey the formed gel film is suitably used. Such a supporting body is preferably used since the cast and applied polyamide acid solution can be dried well and the polyimide film can be continuously produced.

Material and shape of the supporting body are not particularly limited, and a flat plate such as a glass plate or aluminum foil may be used. Moreover, if the endless belt or drum is used as the supporting body, stainless steel is preferably used as its material, as described in Examples later described.

Specific methods and conditions for forming a liquid film on the supporting body are not particularly limited, and various well known methods may be used based on the physical properties and types of the polyamide acid solution, the thickness of the polyimide film to be obtained, the type and manufacturing efficiency of the supporting body, and the like. For instance, in the Examples later described, a liquid film is formed by casting the polyamide acid solution on the supporting body with a Comma coater.

Furthermore, a method for forming a multilayer liquid film in which two or more types of polyamide acids are extruded from respective T dies having different channels is also one example of forming the multilayer liquid film on the supporting body. It is also possible to combine this method with each of steps later described, so as to further add layers to an obtained multilayer polyimide film.

<Gel Film Forming Step>

In the gel film forming step, the liquid film formed on the supporting body is partially cured and/or dried, so as to convert the liquid film to a film of a gel form (also called gel film). The gel film still includes the organic solvent and the like, however has self-supporting properties. The gel film has self-supporting properties, since the solid content (resin content) contained in the gel film is in an intermediate stage of curing from the polyamide acid to the polyimide. The gel film includes a volatile component of for example the organic solvent used for the polyamide acid solution, the curing agent, or a product generated by reaction of the curing agent. A weight of the volatile component is calculated by the following formulation (3):

$$(W_A - W_B) \times 100 / W_B \quad (3)$$

where $W_A$ is a weight of the gel film, and $W_B$ is a weight of the gel film after the gel film is heated at 450° C. for 20 minutes.

The weight (content) of the volatile component calculated by the formulation (3) is preferably within a range of 5% to 500% by weight, is more preferably within a range of 5% to 200% by weight, and is particularly preferably within a range of 5% to 150% by weight. By using a gel film that contains the volatile component of a content within this range, it is possible to avoid breakage of the film in the latter baking step and unevenness of color tone caused by uneven drying of the film. In contrary, if the content of the volatile component in the gel film is not within this range, faults may occur such as an occurrence of anisotropy or unevenness between properties.

The heating and/or drying conditions in converting the liquid film to the gel film is not particularly limited, and a suitable condition is set depending on various conditions such as the type of polyamide acid used, formation state of the liquid film, thickness of the polyimide film to be obtained, and type of curing agent used. Typically, by applying heat on the supporting body at a temperature from 80° C. to 200° C., preferably at a temperature from 100° C. to 180° C., the curing agent is activated, thereby causing partial curing and/or drying to occur.

<Baking Step>

In the baking step, the obtained gel film is peeled off from the supporting body, and then the gel film is heated (baked) to completely imidize any remaining amic acids and to remove the volatile component. This obtains the polyimide film. It is preferable to fix the gel film at its end in a TD direction, in the baking step. This effectively avoids shrinking during the curing. Fixing means is not particularly limited, and a well known tenter pin or clip or the like may be used.

Baking (heating) conditions in the baking step is not particularly limited, as long as the amic acid is completely imidized, and the volatile components, i.e., water generated from the imidization reaction, remaining organic solvent, and remaining curing agent, are removable. Generally, it is preferable to raise the temperature in stags to heat the gel film, by using a plurality of heating ovens (baking ovens). Heating times for each stage is not particularly limited, and a suitable time may be set in accordance with the type of polyamide acid/polyimide, thickness of the polyimide film to be obtained, type of heating oven, and the like. Generally, the heating time is from tens of seconds to several minutes.

In the baking carried out stepwise, it is preferable to heat the film at a final stage at a temperature from 400° C. to 500° C. for 5 to 400 seconds. If the film is heated (baked) at the final stage under such a condition, it is possible to further improve the physical properties of the polyimide film. The heating temperature of the final stage is preferably in a range of 400° C. to 500° C., and is particularly preferably in a range of 400° C. to 480° C. If the heating temperature in the final stage is too low, a tearing strength retention before and after a pressure cooker test (PCT) tends to be low, and if the heating temperature is too high, the color tone tends to be uneven. Hence, such a temperature is not preferred.

Moreover, a heating time of the final stage is sufficient as long as the time is within the foregoing range. However, it is preferable that the heating time is long when a heating temperature is relatively low (is a temperature closer to a lower limit value within the temperature range), and is preferably short when the heating temperature is relatively high (is a temperature closer to an upper limit value within the temperature range). If the heating time is too short, retention of a tearing strength before and after the PCT tends to be low, and if the time is too long, the color tone tends to be uneven.

In the present step, the gel film may be subjected to a minimal amount of tension while the gel film is conveyed in the heating (baking) processing, for the purpose of relaxing an internal stress that remains in the gel film. The heating processing may be carried out simultaneously with the baking step, however such a step may also be separately provided. The tension applied in this step is not particularly limited, however is preferably in a range of 1 N to 100 N, and, is more preferably in a range of 1 N to 50 N. If the tension is within this range, there is no need to apply excess tension to the gel film, thus avoiding deterioration of the physical properties of the obtained polyimide film.

The heating condition in the case where the tension is applied is appropriately set in accordance with properties of the gel film/polyimide film and types of apparatuses used such as a heating oven or the like, and is not particularly limited. However, the heating temperature is generally sufficient being a heating temperature of not less than 200° C. but not more than 500° C., preferably a heating temperature of not less than 250° C. but not more than 500° C., and further preferably a heating temperature of not less than 300° C. but not more than 450° C. The heating time is sufficient being in a range of 1 to 300 seconds, preferably in a range of 2 to 250 seconds, and more preferably in a range of 5 to 200 seconds. By thermally processing the film under such conditions, the internal stress can be relaxed, and a heat shrinkage rate at 200° C. can be reduced.

Furthermore, the gel film may be extended, before or after the fixing of the gel film, to a degree which causes no deterioration to the anisotropy of the obtained polyimide film. In this case, it is preferable that a content of the volatile component in the gel film is of an amount within a range of 100% to 500% by weight, and more preferably within a range of 150% to 500% by weight. If the content of the volatile component is lower than this range, the gel film tends to become difficult to extend, and if the content exceeds the range, the self-supporting property of the film tends to become poor, thereby causing the extending operation itself to be difficult.

Specific methods for carrying out the extending is not particularly limited, and any well known method may be used, such as a method using a differential roll and a method in which a fixed interval of a tenter is broadened.

<Application Step>

A method for casting and applying the polyimide acid solution on a base film is not particularly limited, and existing methods such as use of a die coater, reverse coater, blade coater or the like may be used.

Moreover, if necessary, various surface processing such as corona processing, plasma processing, and coupling processing may be carried out on a surface of the core film, before or after the clad layer is provided.

<Drying>

A condition for drying the film obtained in the application step is not particularly limited, and a suitable condition is set as appropriate depending on various conditions such as the type of polyamide acid used, formation state of the liquid film, thickness of the polyimide film to be obtained, and type of curing agent used. Typically, partial curing and/or drying occurs by heating the film in a temperature range from 80° C. to 200° C., preferably in a temperature range from 100° C. to 180° C.

<Imidization Step>

Either of the chemical imidization method or the thermal imidization method may be used as the method for imidization, and the step is sufficiently carried out by imidizing the film in a temperature range and time similar to the baking step.

Not all of the steps described above are necessarily included in the method in accordance with the present invention for manufacturing the multilayer polyimide film, and a portion of the steps may be omitted or other steps may be added, if necessary. For example, if a polyamide acid solution that is already polymerized is used, the polyamide acid polymerization step can be omitted.

A cover lay obtained by use of the multilayer polyimide film in accordance with the present invention is obtained by providing, by a conventionally known method, a conventionally known adhesive agent such as a polyester-based, acryl-based, epoxy-based or polyimide-based adhesive agent, to one side of the multilayer polyimide film which serves as a base.

A metal-clad laminate obtained by using the multilayer polyimide film in accordance with the present invention may be either configured by (i) forming a laminate on which an adhesive layer is provided on one or each side of the multilayer polyimide film serving as a base film, which adhesive layer is provided by use of a conventionally known adhesive agent such as a polyester-based, acryl-based, epoxy-based or polyimide-based adhesive agent, and thereafter laminating a conductive metal layer thereon, or (ii) directly laminating a conductive metal layer on a surface of the multilayer polyimide film, without providing an adhesive agent therebetween.

EXAMPLES

The following description specifically explains the present invention by use of Examples, however the present invention is not limited to these Examples. Evaluation methods of the modulus of elasticity, coefficient of linear expansion, loop stiffness, and flexing property (MIT test) in Synthesis Examples (Syn. Ex.), Examples (Ex.), and Comparative Examples (Comp. Ex.) are as described below.

(Method for Measuring Modulus of Elasticity)

Moduli of elasticity of the film were measured according to ASTM D-882 in a MD direction (Machine Direction), TD direction (Transverse Direction), molecular orientation axis direction, direction 45° clockwise from the molecular orientation axis, and direction 45° anticlockwise from the molecular orientation axis. An average of these measured moduli of elasticity was recorded as an average modulus of elasticity, in Tables.

(Method for Measuring Coefficient of Linear Expansion)

Coefficients of linear expansion of a polyimide film were measured by using a sample cut into a size having a width of 3 mm and a length of 10 mm, measured with a heat mechanical analysis apparatus manufactured by SII NanoTechnology Inc. having a product name of TMA/SS6100. First, the sample was heated from 0° C. to 460° C. in a tensioned mode having a load of 29.4 mN. Then the sample was cooled to 10° C., and was again heated at a heating rate of 10° C. per minute. An average value of the coefficient of linear expansion was worked out by averaging the coefficients of linear expansion between 100° C. to 200° C. during the second heating. The coefficients of the thermal linear expansion were measured in directions of the film in the MD direction (Machine Direction), TD direction (Transverse Direction), molecular orientation axis direction, direction 45° clockwise from the molecular orientation axis, and direction 45° anticlockwise from the molecular orientation axis, and an average thereof was recorded in the Tables.

(Flexing Property)

The flexing property was measured with a MIT flexing testing apparatus (MIT-D, manufactured by Toyo Seiki Seisaku-sho, Ltd.) under conditions of: R=0.38 mm, tension of 750 gf, bending angle of 135°, and velocity of 175 times/min, by using a sample prepared according to JIS C5016.

(Method for Measuring Loop Stiffness)

With a loop stiffness tester manufactured by Toyo Seiki Seisaku-sho, Ltd., a loop stiffness was measured under conditions of a sample width of 5 mm to 25 mm, a loop length of 50 mm and a pressing distance of 10 mm. A longitudinal direction of the sample was cut out in directions of the sample in the MD direction (Machine Direction), TD direction (Transverse Direction), molecular orientation axis direction, direction 45° clockwise from the molecular orientation axis, and direction 45° anticlockwise from the molecular orientation axis, and their loop stiffness were measured. The sample width was set as appropriate so that an actual measured value became 20 mg to 200 mg, depending on the film thickness. The following description shows a scheme of the measurements.

(1) In a case where measurement is carried out with a sample width of 10 mm, a raw film was cut into a strip of a size 220 mm×10 mm.
(2) The strip was marked with a felt tipped pen or the like at a loop forming part.
(3) The strip was cut into half, to obtain two strips of a size 110 mm×10 mm.
(4) Thickness of the loop forming part of each of the two strips were measured at five points of the strips, and an average of the measurements was interpreted as the thickness of the film.
(5) Stiffness of one of the two strips which had an A side serving as an outer side thereof was measured, and stiffness of the other one of the two strips which had a B side serving as an outer side thereof was measured.
(6) (1) through (5) were measured with n=3; a measured value (mg) was divided by the width (cm) of the measured sample, and an average value of the divided values was calculated, so as to create the data. A smaller value denotes a more flexible film. An average value of the stiffness values measured in directions of the film in the MD direction (Machine Direction), TD direction (Transverse Direction), molecular orientation axis direction, direction 45° clockwise from the molecular orientation axis, and direction 45° anticlockwise from the molecular orientation axis, were recorded in the Tables.

Reference Example 1

Preparation Example of Adhesive Agent for Producing Copper-Clad Laminate

On a protective polyethylene terephthalate (hereinafter referred to as PET) film whose surface had been subjected to peeling agent processing, an adhesive agent was applied of an amount which attains a thickness of 11 μm after the adhesive agent is dried. The resultant film was dried at 120° C. for 2 minutes, thereby obtaining a B stage film on which an adhesive agent is provided. The adhesive agent used was prepared by mixing a diaminodiphenyl sulfone/dicyandiamide 4/1 in 20% methyl cellosolve solution (45 parts by weight) to a solution in which 50 parts by weight of polyamide resin (Prata Bond M1276 manufactured by NIPPON RILSAN), 30 parts by weight of bisphenol A-type epoxy resin (EPICOAT 828, manufactured by Petrochemical Shell Epoxy Co.), 10 parts by weight of cresol-novolac-type epoxy resin, and 150 parts by weight of a mixed solution of toluene/isopropyl alcohol 1/1 were mixed together.

Synthesis Example 1

In a flask made of glass and that has a capacity of 2000 ml, 630 g of DMF, 81.3 g of 2,2-bis[4-(4-aminophenoxy)phenyl]propane (hereinafter also referred to as BAPP) and 17.0 g of 3,4'-diaminodiphenylether (hereinafter also referred to as 3,4'-ODA) were added, and while stirring this mixture under a nitrogen atmosphere, 60.8 g of pyromellitic dianhydride (hereinafter also referred to as PMDA) was gradually added to the mixture. Thereafter, a DMF solution in which PMDA was adjusted to 7.2% by weight was gradually added to the mixture and stirred, while a viscosity of the mixture was carefully watched. When the viscosity reached 3000 poise, the adding and stirring were stopped. This obtained a polyamide acid solution.

Synthesis Example 2

A polyamide acid solution was obtained as with Synthesis Example 1, except that: the weight of BAPP thus used was changed to 41 g; the weight of 3,4'-ODA was changed to 46.6 g; and the weight of PMDA was changed to 71.4 g.

Synthesis Example 3

A polyamide acid solution was obtained as with Synthesis Example 1, except that: the weight of BAPP was changed to 0 g; the weight of 3,4'-ODA was changed to 53.6 g; and the weight of PMDA was changed to 82.2 g.

Synthesis Example 4

In a flask made of glass and that has a capacity of 2000 ml, 549 g of DMF, 43.2 g of BAPP, and 17.0 g of 3,4'-ODA were added, and while stirring this mixture under a nitrogen atmosphere, 22.6 g of 3,3',4,4'-benzophenone tetracarboxylic acid dianhydride (hereinafter also referred to as BTDA), and 16.9 g of PMDA were gradually added to the mixture. Subsequently, 30 minutes later, 94.9 g of a DMF solution with p-phenylenediamine (hereinafter also referred to as p-PDA) adjusted to 20% by weight, and 43.2 g of PMDA were gradually added and stirred to the mixture. Furthermore, a DMF solution in which PMDA was adjusted to 7.2% by weight was gradually added to the mixture and stirred, while a viscosity of the mixture was carefully watched. When the viscosity reached 3000 poise, the adding and stirring were stopped. This obtained a polyamide acid solution.

Synthesis Example 5

In a flask made of glass and that has a capacity of 2000 ml, 670 g of DMF, and 10.6 g of p-phenylene diamine were added, and while stirring this mixture under a nitrogen atmosphere, 17.12 g of PMDA was gradually added to the mixture. Subsequently, 30 minutes later, 12.3 g of 3,4'-ODA and 23.0 g of BAPP were added to the mixture, and further 43.1 g of PMDA was gradually added to the mixture. Thereafter, a DMF solution in which PMDA was adjusted to 7.2% by weight was gradually added and stirred, while the viscosity of the mixture was carefully watched. When the viscosity reached 3000 poise, the adding and stirring were stopped. This obtained a polyamide acid solution.

Synthesis Example 6

In a flask made of glass and that has a capacity of 2000 ml, 600 g of DMF and 60.8 g of 3,4'-ODA were added, and while stirring the mixture under a nitrogen atmosphere, 88.3 g of PMDA was gradually added to the mixture. Subsequently, 30 minutes later, 54.7 g of a DMF solution with p-phenylenediamine adjusted to be 20° A) by weight was added to the mixture, and further a DMF solution with p-phenylenediamine adjusted to 5% by weight was gradually added and stirred, while the viscosity of the mixture was carefully watched. When the viscosity reached 3000 poise, the adding and stirring were stopped. This obtained a polyamide acid solution.

Synthesis Example 7

In a flask made of glass and that has a capacity of 2000 ml, 639 g of DMF, 12.3 g of 3,4'-ODA, and 58.5 g of a DMF solution with p-phenylenediamine adjusted to 20% by weight were added, and while stirring the mixture under a nitrogen atmosphere, 33.3 g of PMDA was gradually added to the mixture. Subsequently, 30 minutes later, 56.9 g of BAPP was added, and this mixture was stirred for 5 minutes. Further, to this solution, 32.9 g PMDA was added and stirred. Thereafter, a DMF solution in which PMDA was adjusted to 7.2% by weight was gradually added and stirred, while the viscosity of the mixture was carefully watched. When the viscosity reached 3000 poise, the adding and stirring were stopped. This obtained a polyamide acid solution.

Synthesis Example 8

In a flask made of glass and that has a capacity of 2000 ml, 606.4 g of DMF, 12.3 g of 3,4'-ODA, 28.1 g of BAPP, and 1.9 g of p-phenylenediamine were added, and while the mixture was stirred under a nitrogen atmosphere, 74.6 g of PMDA was gradually added to the mixture. Furthermore, 30 minutes later, 46.2 g of a DMF solution with p-phenylenediamine adjusted to 20% by weight was added to the mixture. This obtained a polyamide acid solution having a viscosity of 3000 poise.

Synthesis Example 9

In a flask made of glass and that has a capacity of 2000 ml, 585.1 g of DMF, 31.2 g of 3,4'-ODA, and 28.4 g of BAPP were added, and while stirring the mixture under a nitrogen atmosphere, 39.2 g of PMDA were gradually added to the mixture. Subsequently, 30 minutes later, 65.4 g of a DMF solution with p-phenylenediamine adjusted to 20% by weight was added to the mixture, and thereafter 35.1 g of PMDA was gradually added to the mixture. A DMF solution in which PMDA was adjusted to 7.2% by weight was gradually added and stirred, while the viscosity of the mixture was carefully watched. When the viscosity reached 3000 poise, the adding and stirring were stopped. This obtained a polyamide acid solution.

Synthesis Example 10

A polyamide acid solution was obtained as with Synthesis Example 9, except that: the weight of BAPP thus used was changed to 28.6 g; the weight of 3,4'-ODA was changed to 29.3 g; the weight of PMDA added the first time was changed to 42.3 g; the DMF solution with p-phenylenediamine adjusted to 20% by weight was changed to 71.5 g; and the weight of PMDA added the second time was changed to 32.4 g.

Synthesis Example 11

In a flask made of glass and that has a capacity of 2000 ml, 640 g of DMF and 13.1 g of p-phenylenediamine were added, and while stirring this mixture under a nitrogen atmosphere, 23.8 g of PMDA was gradually added to the mixture. Subsequently, 30 minutes later, 31.2 g of 3,4'-ODA and 28.4 g of BAPP were added to the mixture, then further 50.5 g of PMDA was gradually added to the mixture. Thereafter, a DMF solution in which PMDA was adjusted to 7.2% by weight was gradually added and stirred, while the viscosity of the mixture was carefully watched. When the viscosity reached 3000 poise, the adding and stirring were stopped. This obtained a polyamide acid solution.

Synthesis Example 12

A polyamide acid solution was obtained as with Synthesis Example 4, except that: the weight of BAPP thus used was changed to 52.6 g; the weight of 3,4'-ODA was changed to 3.2 g; the weight of PMDA added the first time was changed to 21.3 g; the weight of BTDA was changed to 10.3 g; the DMF solution with p-phenylenediamine adjusted to 20% by weight was changed to 95.2 g; and the weight of PMDA added the second time was changed to 40.9 g.

Synthesis Example 13

A polyamide acid solution was obtained as with Synthesis Example 12, except that: the weight of BAPP thus used was changed to 46.0 g; the DMF solution with p-phenylenediamine was changed to 103.9 g; and the weight of PMDA added the second time was changed to 40.9 g.

Synthesis Example 14

In a flask made of glass and that has a capacity of 2000 ml, 643 g of DMF and 58.0 g of 2,2',3,3'-biphenyl tetracarboxylic acid dianhydride were added, and while stirring the mixture under a nitrogen atmosphere, 79.0 g of BAPP was gradually added to the mixture. Subsequently, a DMF solution in which BAPP was adjusted to 20% by weight was gradually added and stirred, while the viscosity of the mixture was carefully watched. When the viscosity reached 1000 poise, the adding and stirring were stopped. This obtained a polyamide acid solution.

Examples 1, 11, 21

To the polyamide acid solution obtained in Synthesis Example 5, a curing agent constituted of acetic anhydride/ isoquinoline/DMF (weight ratio of 2.0/0.3/4.0) was added so that the curing agent had a weight ratio of 45% with respect to the polyamide acid solution, and this mixture was continuously stirred with a mixer. Thereafter, the mixture was extruded from a T die and was cast on an endless belt made of stainless steel that ran 20 mm below the die. After heating this resin film at 130° C. for 100 seconds, an obtained self-supporting gel film (content of volatile component was 30% by weight) was peeled off from the endless belt. The gel film was fixed to a tentering clip, and was dried and imidized at 300° C. for 22 seconds, at 400° C. for 22 seconds, and at 450° C. for 22 seconds. This thus obtained a polyimide film serving as a core layer. An average modulus of elasticity and average coefficient of linear expansion of the polyimide film serving as the core layer is as shown in Table 1. The polyimide film serving as the core layer was placed in an oven heated to 380° C. and was heated for 2 minutes, however no deformation or wrinkles were observed.

To this polyimide film, a solution was applied to one side of the film with a Comma coater, which solution was prepared by diluting the polyamide acid solution obtained in Synthesis Example 1 with DMF until a solid content concentration became 8% by weight. The applied polyimide film was dried for 15 seconds in an oven heated to 130° C. Further, the solution was applied on the other side of the film so as to have a same thickness as the first application, and the additionally applied polyimide film was dried as with the above. Thereafter, the film was fixed to a tentering clip, and an imidization was performed at 300° C. for 10 seconds, at 400° C. for 10 seconds, and at 450° C. for 15 seconds. This attained a polyimide film having a three-layer structure in which a total thickness of the film was 10 μm for Example 1, 12.5 μm for Example 11, and 25 μm for Example 21. An average modulus of elasticity, average coefficient of linear expansion, and stiffness value of these polyimide films having the three-layer structure are as shown in Table 1.

Furthermore, to the polyamide acid solution obtained in Synthesis Example 1, a curing agent constituted of acetic anhydride/isoquinoline/DMF (weight ratio of 2.0/0.3/4.0) was added so that the curing agent had a weight ratio of 45% with respect to the polyamide acid solution, and this mixture was continuously stirred with a mixer. Thereafter, the mixture was extruded from a T die and was cast on an endless belt made of stainless steel that ran 20 mm below the die. After heating this resin film at 130° C. for 100 seconds, an obtained self-supporting gel film (content of volatile component was 30% by weight) was peeled off from the endless belt. The gel film was fixed to a tentering clip, and was dried and imidized at 300° C. for 22 seconds, at 400° C. for 22 seconds, and at 450° C. for 22 seconds. This obtained a polyimide layer of a single layer film having a thickness of 12.5 μm, which served as the clad layer. An average modulus of elasticity, average coefficient of linear expansion and peeling strength of this film is as shown in Table 1.

Examples 2, 3, 12, 13, 22, 23

A single layer polyimide film serving as the core layer, a single layer film of a polyimide layer serving as the clad layer, and a polyimide film of a three-layer structure were obtained as with Example 1, except that the polyamide acid used for the application was changed to the polyamide acid solution of Synthesis Example 2. Properties of the obtained polyimide films are as shown in Table 1.

Examples 4, 5, 14, 15, 24, 25

A single layer polyimide film serving as a core layer, a single layer film of a polyimide layer serving as a clad layer, and a polyimide film of a three-layer structure were obtained as with Example 1, except that the polyamide acid used for the application was changed to the polyamide acid solution of Synthesis Example 3. Properties of the obtained polyimide films are as shown in Table 1.

Examples 6, 16, 26

To the polyamide acid solution obtained in Synthesis Example 4, a curing agent constituted of acetic anhydride/isoquinoline/DMF (weight ratio of 2.0/0.3/4.0) was added so that the curing agent had a weight ratio of 45% with respect to the polyamide acid solution, and the mixture was continuously stirred with a mixer. Thereafter, the mixture was extruded from a T die on an endless belt made of stainless steel that ran 20 mm below the die. After heating this resin film at 130° C. for 100 seconds, an obtained self-supporting gel film (content of volatile component contained was 30% by weight) was peeled off from the endless belt. The gel film was fixed to a tentering clip, and was dried and imidized at 300° C. for 22 seconds, at 400° C. for 22 seconds, and at 450° C. for 22 seconds. This obtained a polyimide film serving as a core layer. An average modulus of elasticity and average coefficient of linear expansion of this polyimide film serving as the core layer is as shown in Table 1. The polyimide film serving as the core layer was placed in an oven heated to 380° C. and was heated for 2 minutes, and as a result, no deformation or wrinkles were observed.

To this polyimide film, a solution was applied to one side of the film with a Comma coater, which solution was prepared by diluting the polyamide acid solution obtained in Synthesis Example 1 with DMF until a solid content concentration became 8% by weight. This applied polyimide film was dried in an oven heated to 130° C., for 15 seconds. Furthermore, the solution was applied to the other side of the film, and the additionally applied film was dried as with the above. Thereafter, the film was fixed to a tentering clip, and imidization was performed at 300° C. for 10 seconds, at 400° C. for 10 seconds, and at 450° C. for 15 seconds. This obtained a polyimide film having a three-layer structure of a thickness of 10 μm for Example 6, 12.5 μm for Example 16, and 25 μm for Example 26. Properties of the core layer polyimide film and the polyimide film having the three-layer structure are as shown in Table 1.

Examples 7, 8, 17, 18, 27, 28

A polyimide film having a three-layer structure was obtained as with Example 6, except that the polyamide acid used for the application was changed to the polyamide acid solution of Synthesis Example 2. Properties of the obtained polyimide films having the three-layer structure are as shown in Table 1.

Examples 9, 10, 19, 20, 29, 30

A polyimide film having a three-layer structure was obtained as with Example 6, except that the polyamide acid used for the application was changed to the polyamide acid solution of Synthesis Example 3. Properties of the obtained polyimide films having the three-layer structure are as shown in Table 1.

Example 31

The adhesive surface of the PET film obtained in Reference Example 1 that has the B-stage adhesive agent was adhered to the three-layer polyimide film of Example 12, and this film was compressed at 90° C. with a pressure of 1 kg/cm². Thereafter, the PET film was peeled off, and then was adhered to a copper foil (copper foil (BHY-22BT) having a thickness of 18 μm, manufactured by Japan Energy Corporation) by a roll laminating method. Adhesion was carried out at a temperature of 120° C. and with a pressure of 2 kg/cm². Finally, the film was heated in steps of: at 60° C. for 3 hours, at 80° C. for 3 hours, at 120° C. for 3 hours, at 140° C. for 3 hours, and at 160° C. for 4 hours. Following this, the film was cooled to cure the adhesive agent, thereby obtaining a copper-clad laminate. A sample for evaluating flexing property was prepared with the copper-clad laminate, to carry out a flexing property evaluation (MIT test). A result thereof is as shown in Table 4.

Example 32

The three-layered polyimide film obtained in Example 12 was adhered to an adhesive agent for cover lay ZT782-15 manufactured by Hitachi Kasei Polymer Co., Ltd., and this film was compressed at 90° C. with a pressure of 1 kg/cm². This cover lay was adhered to the pattern obtained in Example 31 at 90° C. with a pressure of 1 kg/cm², and thereafter the adhered pattern with the cover lay was heated to 180° C. under a pressure of 3 kg/cm², to cure for 1 hour. A result of the MIT test for the pattern with the cover lay is as shown in Table 5.

Comparative Examples 1, 8, 17

To the polyamide acid solution obtained in Synthesis Example 7, a curing agent constituted of acetic anhydride/ isoquinoline/DMF (weight ratio of 2.0/0.3/4.0) was added so that the curing agent had a weight ratio of 45% with respect to the polyamide acid solution, and this mixture was continuously stirred with a mixer. Thereafter, the mixture was extruded from a T die and was cast on an endless belt made of stainless steel that ran 20 mm below the die. After heating this resin film at 130° C. for 100 seconds, an obtained self-supporting gel film (content of volatile component was 30% by weight) was peeled off from the endless belt. The gel film was fixed to a tentering clip, and was dried and imidized at 300° C. for 22 seconds, at 400° C. for 22 seconds, and at 450° C. for 22 seconds. This obtained a single layer polyimide film of 10 μm for Comparative Example 1, 12.5 μm for Comparative Example 8, and 25 μm for Comparative Example 17. Properties of the obtained single layer polyimide films are as shown in Table 2.

Comparative Examples 2, 9, 18

Single layer polyimide films were obtained as with Comparative Example 1, except that the polyamide acid solution obtained in Synthesis Example 8 was used. Properties of the obtained single layer polyimide films are as shown in Table 2.

Comparative Examples 3, 10, 19

Single layer polyimide films were obtained as with Comparative Example 1, except that the polyamide acid solution obtained in Synthesis Example 9 was used. Properties of the obtained single layer polyimide films are as shown in Table 2.

Comparative Examples 4, 12, 20

Single layer polyimide films were obtained as with Comparative Example 1, except that the polyamide acid solution obtained in Synthesis Example 10 was used. Properties of the obtained single layer polyimide films are as shown in Table 2.

Comparative Examples 5, 13, 21

Single layer polyimide films were obtained as with Comparative Example 1, except that the polyamide acid solution obtained in Synthesis Example 11 was used. Properties of the obtained single layer polyimide films are as shown in Table 2.

Comparative Examples 6, 14, 22

Single layer polyimide films were obtained as with Comparative Example 1, except that the polyamide acid solution obtained in Synthesis Example 12 was used. Properties of the obtained single layer polyimide films are as shown in Table 2.

Comparative Examples 7, 15, 23

Single layer polyimide films were obtained as with Comparative Example 1, except that the polyamide acid solution obtained in Synthesis Example 13 was used. Properties of the obtained single layer polyimide films are as shown in Table 2.

Comparative Example 11

A single layer polyimide film was obtained as with Comparative Example 1, except that the polyamide acid solution obtained in Synthesis Example 6 was used to obtain a single layer polyimide film having a thickness of 12.5 μm. Properties of the obtained single layer polyimide film are as shown in Table 2.

Comparative Example 16

To the polyamide acid solution obtained in Synthesis Example 14, a mixed solvent constituted of dioxolane:DMF=1:1 was added so as to be an amount of 50% by weight with respect to the weight of the polyamide acid solution. This diluted the polyamide acid solution. The diluted polyamide acid solution was cast on an aluminum foil with a Comma coater, to obtain a resin film. After the resin film was heated at 130° C. for 100 seconds, the resin film was fixed to a tentering clip together with the aluminum foil, and was imidized at 250° C. for 60 seconds, then at 350° C. for 120 seconds. The aluminum foil was removed by melting the aluminum foil with 1N hydrochloric acid solution. This obtained a single layer polyimide film of 12.5 μm. Properties of the obtained single layer polyimide film are as shown in Table 2.

Comparative Example 24

A polyimide film having a three-layer structure and a total thickness of 12.5 μm was obtained as with Example 11, except that the thickness component ratio of the clad layer was 60%. Properties of the obtained multilayer polyimide film are as shown in Table 3.

Comparative Example 25

A polyimide film having a three-layer structure and a total thickness of 12.5 μm was obtained as with Example 12, except that the thickness component ratio of the clad layer was 60%. Properties of the obtained multilayer polyimide film are as shown in Table 3.

Comparative Examples 26 and 27

A polyimide film having a three-layer structure and a total thickness of 12.5 μm was obtained as with Examples 12 and 13, except that the polyamide acid solution obtained in Synthesis Example 5 was applied to the clad layer, as with the core layer. Properties of the obtained multilayer polyimide films are as shown in Table 3.

Comparative Example 28

A polyimide film having a three-layer structure and a total thickness of 12.5 μm was obtained as with Example 16, except that the polyamide acid solution used for the clad layer was changed to the polyamide acid solution obtained in Synthesis Example 14, and that the thickness component ratio of the clad layer was 15%. Properties of the obtained multilayer polyimide film are as shown in Table 3.

Comparative Example 29

A polyimide film having a three-layer structure and a total thickness of 12.5 μm was obtained as with Example 11, except that the polyamide acid solution used for the core layer was changed to the polyamide acid obtained in Synthesis Example 3, and that the thickness component ratio of the clad layer was changed to 10%. Properties of the obtained multilayer polyimide film are as shown in Table 3.

Comparative Example 30

A copper-clad laminate and pattern were produced and a MIT test was carried out as with Example 31, except that the adhesive surface of the PET film obtained in Reference Example 1 having the B-stage adhesive agent was adhered to the single layer polyimide film of Comparative Example 9. Results thereof are shown in Table 4.

Comparative Example 31

A single layer polyimide film of 12.5 μm was obtained as with Comparative Example 1, except that the polyamide acid solution obtained in Synthesis Example 3 was used. Properties of the obtained single layer film are as shown in Table 4.

Comparative Example 32

A copper-clad laminate and pattern were produced and a MIT test was carried out as with Example 31, except that the single layer film obtained in Comparative Example 31 was used. Results thereof are shown in Table 4.

Comparative Example 33

A pattern with a cover lay was obtained as with Example 32, except that the single layer film obtained in Comparative Example 9 was used as the base film and the cover lay film. A result of the MIT test for this pattern is as shown in Table 5.

TABLE 1

| | Core Layer | | | Clad Layer | | | | | Multilayer Film | | | | | Judgment | | | |
|---|---|---|---|---|---|---|---|---|---|---|---|---|---|---|---|---|---|
| | Used | Av. M.E. | Av. C.L.E. ppm/ | Th. | Used | P.S. N/ | Av. M.E. | Av. C.L.E. ppm/ | C.L. Th. | C.F. | T.T. | Av. C.L.E. ppm/ | Av. M.E. | St. mg/ | | | Flexibility | |
| Ex. | P.A. | GPa | °C. | μm | P.A. | cm | GPa | °C. | μm | % | μm | °C. | GPa | cm | N.A. | D.S. | Jud. | R.r. |
| 1 | Syn. Ex. 5 | 4.5 | 16 | 8 | Syn. Ex. 1 | 1.5 | 2.5 | 58 | 2 | 20 | 10 | 26 | 4.1 | 44 | ○ | ○ | ○ | 14 |
| 2 | Syn. Ex. 5 | 4.5 | 16 | 8 | Syn. Ex. 2 | 0.5 | 2.7 | 48 | 2 | 20 | 10 | 22 | 4.1 | 45 | ◎ | ◎ | ○ | 13 |
| 3 | Syn. Ex. 5 | 4.5 | 16 | 6 | Syn. Ex. 2 | 0.5 | 2.7 | 48 | 4 | 40 | 10 | 29 | 3.8 | 38 | ◎ | ○ | ○ | 18 |
| 4 | Syn. Ex. 5 | 4.5 | 16 | 8 | Syn. Ex. 3 | 0 | 3.6 | 32 | 2 | 20 | 10 | 19 | 4.3 | 50 | ◎ | ◎ | ○ | 6 |
| 5 | Syn. Ex. 5 | 4.5 | 16 | 6 | Syn. Ex. 3 | 0 | 3.6 | 32 | 4 | 40 | 10 | 22 | 4.1 | 47 | ◎ | ◎ | ○ | 8 |
| 6 | Syn. Ex. 4 | 6.5 | 12 | 9 | Syn. Ex. 1 | 1.5 | 2.5 | 58 | 1 | 10 | 10 | 18 | 6.1 | 67 | ○ | ◎ | ○ | 11 |
| 7 | Syn. Ex. 4 | 6.5 | 12 | 9 | Syn. Ex. 2 | 0.5 | 2.7 | 48 | 1 | 10 | 10 | 16 | 6.1 | 68 | ◎ | ◎ | ○ | 11 |
| 8 | Syn. Ex. 4 | 6.5 | 12 | 6 | Syn. Ex. 2 | 0.5 | 2.7 | 48 | 4 | 40 | 10 | 26 | 5.0 | 44 | ◎ | ○ | ◎ | 29 |
| 9 | Syn. Ex. 4 | 6.5 | 12 | 9 | Syn. Ex. 3 | 0 | 3.6 | 32 | 1 | 10 | 10 | 14 | 6.2 | 71 | ◎ | ◎ | ○ | 8 |
| 10 | Syn. Ex. 4 | 6.5 | 12 | 5 | Syn. Ex. 3 | 0 | 3.6 | 32 | 5 | 50 | 10 | 22 | 5.1 | 49 | ◎ | ◎ | ◎ | 22 |
| 11 | Syn. Ex. 5 | 4.5 | 16 | 10 | Syn. Ex. 1 | 1.5 | 2.5 | 58 | 2.5 | 20 | 12.5 | 26 | 4.1 | 85 | ○ | ○ | ○ | 14 |
| 12 | Syn. Ex. 5 | 4.5 | 16 | 10 | Syn. Ex. 2 | 0.5 | 2.7 | 48 | 2.5 | 20 | 12.5 | 22 | 4.1 | 88 | ◎ | ◎ | ○ | 13 |
| 13 | Syn. Ex. 5 | 4.5 | 16 | 7.5 | Syn. Ex. 2 | 0.5 | 2.7 | 48 | 5 | 40 | 12.5 | 29 | 3.8 | 75 | ◎ | ○ | ○ | 18 |
| 14 | Syn. Ex. 5 | 4.5 | 16 | 10 | Syn. Ex. 3 | 0 | 3.6 | 32 | 2.5 | 20 | 12.5 | 19 | 4.3 | 98 | ◎ | ◎ | ○ | 6 |
| 15 | Syn. Ex. 5 | 4.5 | 16 | 7.5 | Syn. Ex. 3 | 0 | 3.6 | 32 | 5 | 40 | 12.5 | 22 | 4.1 | 92 | ◎ | ◎ | ○ | 8 |
| 16 | Syn. Ex. 4 | 6.5 | 12 | 11.25 | Syn. Ex. 1 | 1.5 | 2.5 | 58 | 1.25 | 10 | 12.5 | 18 | 6.1 | 131 | ○ | ◎ | ○ | 11 |
| 17 | Syn. Ex. 4 | 6.5 | 12 | 11.25 | Syn. Ex. 2 | 0.5 | 2.7 | 48 | 1.25 | 10 | 12.5 | 16 | 6.1 | 132 | ◎ | ◎ | ○ | 11 |
| 18 | Syn. Ex. 4 | 6.5 | 12 | 7.5 | Syn. Ex. 2 | 0.5 | 2.7 | 48 | 5 | 40 | 12.5 | 26 | 5.0 | 85 | ◎ | ○ | ◎ | 29 |
| 19 | Syn. Ex. 4 | 6.5 | 12 | 11.25 | Syn. Ex. 3 | 0 | 3.6 | 32 | 1.25 | 10 | 12.5 | 14 | 6.2 | 138 | ◎ | ◎ | ○ | 8 |
| 20 | Syn. Ex. 4 | 6.5 | 12 | 6.25 | Syn. Ex. 3 | 0 | 3.6 | 32 | 6.25 | 50 | 12.5 | 22 | 5.1 | 96 | ◎ | ◎ | ◎ | 22 |
| 21 | Syn. Ex. 5 | 4.5 | 16 | 20 | Syn. Ex. 1 | 1.5 | 2.5 | 58 | 5 | 20 | 25 | 26 | 4.1 | 681 | ○ | ○ | ○ | 14 |
| 22 | Syn. Ex. 5 | 4.5 | 16 | 20 | Syn. Ex. 2 | 0.5 | 2.7 | 48 | 5 | 20 | 25 | 22 | 4.1 | 700 | ◎ | ◎ | ○ | 13 |
| 23 | Syn. Ex. 5 | 4.5 | 16 | 15 | Syn. Ex. 2 | 0.5 | 2.7 | 48 | 10 | 40 | 25 | 29 | 3.8 | 597 | ◎ | ○ | ○ | 18 |
| 24 | Syn. Ex. 5 | 4.5 | 16 | 20 | Syn. Ex. 3 | 0 | 3.6 | 32 | 5 | 20 | 25 | 19 | 4.3 | 785 | ◎ | ◎ | ○ | 6 |
| 25 | Syn. Ex. 5 | 4.5 | 16 | 15 | Syn. Ex. 3 | 0 | 3.6 | 32 | 10 | 40 | 25 | 22 | 4.1 | 734 | ◎ | ◎ | ○ | 8 |
| 26 | Syn. Ex. 4 | 6.5 | 12 | 22.5 | Syn. Ex. 1 | 1.5 | 2.5 | 58 | 2.5 | 10 | 25 | 18 | 6.1 | 1047 | ○ | ◎ | ○ | 11 |

TABLE 1-continued

| | Core Layer | | | | Clad Layer | | | | Multilayer Film | | | | | | Judgment | | | |
|---|---|---|---|---|---|---|---|---|---|---|---|---|---|---|---|---|---|---|
| Ex. | Used P.A. | Av. M.E. GPa | Av. C.L.E. ppm/°C. | Th. μm | Used P.A. | P.S. N/cm | Av. M.E. GPa | Av. C.L.E. ppm/°C. | C.L. Th. μm | C.F. % | T.T. μm | Av. C.L.E. ppm/°C. | Av. M.E. GPa | St. mg/cm | N.A. | D.S. | Flexibility Jud. | R.r. |
| 27 | Syn. Ex. 4 | 6.5 | 12 | 22.5 | Syn. Ex. 2 | 0.5 | 2.7 | 48 | 2.5 | 10 | 25 | 16 | 6.1 | 1058 | ◎ | ◎ | ○ | 11 |
| 28 | Syn. Ex. 4 | 6.5 | 12 | 15 | Syn. Ex. 2 | 0.5 | 2.7 | 48 | 10 | 40 | 25 | 26 | 5.0 | 681 | ◎ | ○ | ◎ | 29 |
| 29 | Syn. Ex. 4 | 6.5 | 12 | 22.5 | Syn. Ex. 3 | 0 | 3.6 | 32 | 2.5 | 10 | 25 | 14 | 6.2 | 105 | ◎ | ◎ | ○ | 8 |
| 30 | Syn. Ex. 4 | 6.5 | 12 | 12.5 | Syn. Ex. 3 | 0 | 3.6 | 32 | 12.5 | 50 | 25 | 22 | 5.1 | 766 | ◎ | ◎ | ◎ | 22 |

*Used P.A.: Used Polyamide Acid;
Av. C.L.E.: Average Coefficient of Linear Expansion
C.L. Th.: Thickness of Clad Layer
T.T.: Total Thickness
D.S.: Dimensional Stability
Av. M.E.: Average Modulus of Elasticity;
Th.: Thickness
C.F.: Component ratio of Clad Film to Entire Film
St.: Stiffness
Jud.: Judgment
P.S.: Peeling Strength
N.A.: Non-adhesiveness
R.r: Reduction rate

TABLE 2

| Comp. Ex. | Used P.A. | Th. μm | Av. C.L.E ppm/°C. | Av. M.E. GPa | P.S. N/cm | St. mg/cm |
|---|---|---|---|---|---|---|
| 1 | Syn. Ex. 7 | 10 | 27 | 3.8 | 0 | 47 |
| 2 | Syn. Ex. 8 | 10 | 22 | 4.1 | 0 | 51 |
| 3 | Syn. Ex. 9 | 10 | 21 | 4.3 | 0 | 53 |
| 4 | Syn. Ex. 10 | 10 | 14 | 5.0 | 0 | 62 |
| 5 | Syn. Ex. 11 | 10 | 11 | 5.1 | 0 | 63 |
| 6 | Syn. Ex. 12 | 10 | 10 | 6.1 | 0 | 75 |
| 7 | Syn. Ex. 13 | 10 | 9 | 6.2 | 0 | 77 |
| 8 | Syn. Ex. 7 | 12.5 | 27 | 3.8 | 0 | 92 |
| 9 | Syn. Ex. 3 | 12.5 | 22 | 4.1 | 0 | 99 |
| 10 | Syn. Ex. 9 | 12.5 | 21 | 4.3 | 0 | 104 |
| 11 | Syn. Ex. 6 | 12.5 | 16 | 4.5 | 0 | 109 |
| 12 | Syn. Ex. 10 | 12.5 | 14 | 5.0 | 0 | 121 |
| 13 | Syn. Ex. 11 | 12.5 | 11 | 5.1 | 0 | 123 |
| 14 | Syn. Ex. 12 | 12.5 | 10 | 6.1 | 0 | 147 |
| 15 | Syn. Ex. 13 | 12.5 | 9 | 6.2 | 0 | 150 |
| 16 | Syn. Ex. 14 | 12.5 | 48 | 3.5 | 13 | 85 |
| 17 | Syn. Ex. 7 | 25 | 27 | 3.8 | 0 | 735 |
| 18 | Syn. Ex. 8 | 25 | 22 | 4.1 | 0 | 793 |
| 19 | Syn. Ex. 9 | 25 | 21 | 4.3 | 0 | 831 |
| 20 | Syn. Ex. 10 | 25 | 14 | 5.0 | 0 | 967 |
| 21 | Syn. Ex. 11 | 25 | 11 | 5.1 | 0 | 986 |
| 22 | Syn. Ex. 12 | 25 | 10 | 6.1 | 0 | 1179 |
| 23 | Syn. Ex. 13 | 25 | 9 | 6.2 | 0 | 1199 |

*Used P.A.: Used Polyamide Acid;
Av. M.E.: Average Modulus of Elasticity;
Av. C.L.E.: Average Coefficient of Linear Expansion
Th.: Thickness
P.S.: Peeling Strength
St.: Stiffness

TABLE 3

| | Core Layer | | | | Clad Layer | | | | Multilayer Film | | | | | | Judgment | | | |
|---|---|---|---|---|---|---|---|---|---|---|---|---|---|---|---|---|---|---|
| Comp Ex. | Used P.A. | Av. M.E. GPa | Av. C.L.E. ppm/°C. | Th. μm | Used P.A. | P.S. N/cm | Av. M.E. GPa | Av. C.L.E. ppm/°C. | C.L. Th. μm | C.F. % | T.T. μm | Av. C.L.E. ppm/°C. | Av. M.E. GPa | St. mg/cm | N.A. | D.S. | Flexibility Jud. | R.r. |
| 24 | Syn. Ex. 5 | 4.5 | 16 | 5.0 | Syn. Ex. 1 | 1.5 | 2.5 | 58 | 7.5 | 60 | 12.5 | 41 | 3.5 | 64 | ○ | X | ◎ | 24 |
| 25 | Syn. Ex. 5 | 4.5 | 16 | 5.0 | Syn. Ex. 2 | 1.5 | 2.7 | 48 | 7.5 | 60 | 12.5 | 35 | 3.5 | 68 | ○ | X | ◎ | 20 |
| 26 | Syn. Ex. 5 | 4.5 | 16 | 10.0 | Syn. Ex. 5 | 0 | 4.5 | 16 | 2.5 | 20 | 12.5 | 16 | 4.5 | 106 | ◎ | ◎ | X | 0 |
| 27 | Syn. Ex. 5 | 4.5 | 16 | 7.5 | Syn. Ex. 5 | 0 | 4.5 | 16 | 5.0 | 40 | 12.5 | 16 | 4.5 | 104 | ◎ | ◎ | X | 0 |
| 28 | Syn. Ex. 4 | 6.5 | 12 | 10.6 | Syn. Ex. 14 | 13 | 3.5 | 58 | 1.9 | 15 | 12.5 | 19 | 6.1 | 129 | X | ◎ | ◎ | 12 |

TABLE 3-continued

| | | Core Layer | | | Clad Layer | | | | Multilayer Film | | | | | | Judgment | | |
|---|---|---|---|---|---|---|---|---|---|---|---|---|---|---|---|---|---|
| Comp Ex. | Used P.A. | Av. M.E. GPa | Av. C.L.E. ppm/°C. | Th. μm | Used P.A. | P.S. N/cm | Av. M.E. GPa | Av. C.L.E. ppm/°C. | C.L. Th. μm | C.F. % | T.T. μm | Av. C.L.E. ppm/°C. | Av. M.E. GPa | St. mg/cm | N.A. | D.S. | Flexibility Jud. | R.r. |
| 29 | Syn. Ex. 3 | 3.6 | 32 | 11.25 | Syn. Ex. 1 | 1.5 | 2.5 | 58 | 1.25 | 10 | 12.5 | 35 | 3.5 | 80 | ◯ | X | ◯ | 5 |

*Used P.A.: Used Polyamide Acid;
Av. C.L.E.: Average Coefficient of Linear Expansion
C.L. Th.: Thickness of Clad Layer
T.T.: Total Thickness
D.S.: Dimensional Stability
Av. M.E.: Average Modulus of Elasticity;
Th.: Thickness
C.F.: Component ratio of Clad Film to Entire Film
St.: Stiffness
Jud.: Judgment
P.S.: Peeling Strength
N.A.: Non-adhesiveness
R.r: Reduction rate

TABLE 4

| | | Base Film | | | MIT Test |
|---|---|---|---|---|---|
| entry | Used Film | Av. M.E. GPa | Av. C.L.E ppm/°C. | St. mg/cm | No. of times |
| Ex. 31 | Ex. 12 | 4.1 | 22 | 88 | 276 |
| Comp. Ex. 30 | Comp. Ex. 9 | 4.1 | 22 | 99 | 206 |
| Comp. Ex. 32 | Comp. Ex. 33 | 3.6 | 32 | 87 | 282 |

*Av. M.E.: Average Modulus of Elasticity;
Av. C.L.E.: Average Coefficient of Linear Expansion
St.: Stiffness

TABLE 5

| entry | Base Film | Cover Lay Film | MIT Test No. of times |
|---|---|---|---|
| Ex. 32 | Ex. 12 | Ex. 12 | 2200 |
| Comp. Ex. 33 | Comp. Ex. 9 | Comp. Ex. 9 | 1600 |

(Interpretation of Evaluation Result)

Standards for judgment in Tables 1 and 3 were as follows:

(Non-Adhesiveness)

Films that had a peeling strength of less than 1.5 N/cm were marked with a double circle.

Films that had a peeling strength of not less than 1.5 N/cm but not more than 3 N/cm were marked with a single circle. Films that had a peeling strength of more than 3 N/cm were marked with a cross.

In a case where a copper-clad laminate was produced with a film marked with the double circle or circle, no adhesion occurred between the films, thereby causing no effect to the film conveyance. However in a case where the copper-clad laminate was produced with the film marked with a cross, a part of the films adhered together, and the film thus showed low conveying property.

(Dimensional Stability)

The multilayer polyimide films having an average coefficient of linear expansion of not less than 12 ppm/° C. but not more than 25 ppm/° C. were marked with a double circle.

The multilayer polyimide films having an average coefficient of linear expansion of not less than 9 ppm/° C. but not more than 30 ppm/° C., and which were not within the range indicated by the double circle, were marked with a single circle.

The multilayer polyimide films having an average coefficient of linear expansion that exceed the ranges indicated by the circle and double circle were marked with a cross.

In the case where a copper-clad laminate was produced with a film marked with a double circle or a circle, no fault in its external view was observed, however in the case where the film marked with the cross was used, there were some cases where a fault such as wrinkles, distortion, warp or the like was generated, thereby causing a poor external view.

(Flexibility)

The films that have a value of not less than 20 calculated from the following formulation:

(stiffness value of Comparative Example–stiffness value of multilayer polyimide film)/stiffness value of Comparative Example×100

(this calculation value is shown as "reduction rate" in Tables) with respect to a Comparative Example in Table 2 having a same thickness and average modulus of elasticity, were marked with a double circle.

The films that have the "reduction rate" of not less than 5 but less than 20 with respect to the Comparative Example in Table 2 having the same thickness and average modulus of elasticity, were marked with a single circle.

The films that have the "reduction rate" of less than 5 with respect to the Comparative Example in Table 2 having the same thickness and average modulus of elasticity, were marked with a cross.

The "reduction rate" shows how much the stiffness value of the multilayer polyimide film has decreased, in comparison to a single layer polyimide film with the multilayer polyimide film that have identical modulus of elasticity and identical thickness, i.e. shows how much the multilayer film is more flexible than the single layer film. The larger the number, the larger the degree of decrease in the stiffness value.

In a case where a copper-clad laminate was produced with a multilayer film marked with the double circle or circle, the copper-clad laminate was more flexible and tended to maintain its shape when the laminate was bent, as compared to a copper-clad laminate produced with a single layer film having the same modulus of elasticity. However in a case where the copper-clad laminate was produced with the multilayer film marked with the cross, the copper-clad laminate showed little change in the flexibility, and was observed to have a strong tendency to return to its original form when the laminate was deformed, as compared to the copper-clad laminate made with the single layer film having the same modulus of elasticity.

The following enumerates classes of the multilayer polyimide films and single layer polyimide films having the same thickness and modulus of elasticity, which classes should be directly compared. With the film having a thickness of 10 μm, the films of Example 1, 2 and 5 are comparable with that of Comparative Example 2; the film of Example 3 is comparable with that of Comparative Example 1; the film of Example 4 is comparable with that of Comparative Example 3; the films of Example 6 and 7 are comparable with that of Comparative Example 6; the film of Example 8 is comparable with that of Comparative Example 4; the film of Example 9 is comparable with that of Comparative Example 7; and the film of Example 10 is comparable with that of Comparative Example 5. In each of these cases, the multilayer film does not have an average coefficient of linear expansion exceeding a value of 30 ppm/° C., and the stiffness value is decreased as compared to the single layer film having the same modulus of elasticity.

Similarly, with the film having a thickness of 12.5 μm, the films of Example 11, 12 and 15 are comparable with that of Comparative Example 9; the film of Example 13 is comparable with that of Comparative Example 8; the film of Example 14 is comparable with Comparative Example 10; the films of Example 16 and 17 are comparable with that of Comparative Example 14; the film of Example 18 is comparable with that of Comparative Example 12; the film of Example 19 is comparable with that of Comparative Example 15; and the film of Example 20 is comparable with that of Comparative Example 13. With the films having the thickness of 25 μm, the films of Example 21, 22 and 25 are comparable with that of Comparative Example 18; the film of Example 23 is comparable with that of Comparative Example 17; the film of Example 24 is comparable with that of Comparative Example 19; the films of Example 26 and 27 are comparable with that of Comparative Example 22; the film of Example 28 is comparable with that of Comparative Example 20; the film of Example 29 is comparable with that of Comparative Example 23; and the film of Example 30 is comparable with that of Comparative Example 21. With these multilayer films also, their average coefficient of linear expansion does not exceed a value of 30 ppm/° C., and the stiffness value is decreased more than that of the single layer film having the same modulus of elasticity.

Furthermore, as clear from Examples 12 and 13 and Comparative Examples 26 and 27, even if the thickness component ratio of the clad layer are the same, as long as the modulus of elasticity is not different between the core layer and that of the clad layer, no change occurs to the stiffness value even if the film was made to have a multilayer structure. Therefore, it is clear that no effect is attained. Moreover, as clear from Examples 19 and 20 and Comparative Example 28, even if there were a difference in the modulus of elasticity of the core layer and that of the clad layer, in a case where a resin that has a strong peeling strength was used, a strong adhesive property was possessed also by the multilayer polyimide film. As a result, the conveying property of the multilayer polyimide film was affected due to the use of such a resin.

Moreover, with the multilayer polyimide film of the present invention, the average coefficient of linear expansion of the core layer is in a range from 5 ppm/° C. to 20 ppm/° C. As clear from the comparison of the film of Example 16 with that of Comparative Example 29, if the average coefficient of linear expansion of the core layer is too large in value, the average coefficient of linear expansion of the multilayer polyimide film also becomes too large, thereby causing degrading in dimensional stability.

In Table 4, as clearly shown by comparing Example 31 with Comparative Example 30, with a copper-clad laminate configured by having the multilayer polyimide film in accordance with the present invention serve as a base film and having an adhesive layer provided thereon, even if the film has the same modulus of elasticity, use of the film of Example 31 as the base film, which film has a low stiffness value, allows the multilayer polyimide film to have a higher flexing property. Moreover, as clear from comparing Example 31 with Comparative Example 32, even if the stiffness value is the same, the single layer film has a higher average coefficient of linear expansion. When a copper-clad laminate was made by use of the film of Example 31, no fault appeared in its external appearance, however when the film of Comparative Example was used, twisting and wrinkles on the copper-clad laminate were observed.

Moreover, as shown in Table 5, in a case where the multilayer polyimide film in accordance with the present invention is used as the base film and cover lay film, the comparison between Example 32 and Comparative Example 33 clearly demonstrates that a higher flexing property is possessed by using the multilayer structure polyimide film in accordance with the present invention.

As described above, it is possible to attain, as in the present invention, a multilayer polyimide film having both dimensional stability and flexibility, by producing the multilayer polyimide film by combining the average coefficient of linear expansion, average modulus of elasticity, peeling strength and the like of the core layer and clad layer as appropriate.

The invention claimed is:

1. A multilayer polyimide film being a polyimide film having a multilayer structure, comprising:
a core layer; and
clad layers provided on each side of the film, the clad layers being exposed,
the core layer being a non-thermoplastic polyimide having an average coefficient of linear expansion at a temperature from 100° C. to 200° C. in a range of 5 ppm/° C. to 20 ppm/° C., each of the clad layers being a polyimide having a peeling strength of 3 N/cm or less,
the film as a whole having an average coefficient of linear expansion at a temperature from 100° C. to 200° C. in a range of 9 ppm/° C. to 30 ppm/° C., and $$(a) > (b) \qquad (1),$$

where (a) is an average modulus of elasticity of the core layer and (b) is an average modulus of elasticity of the clad layers;
wherein the peeling strength denotes an adhesion strength determined by the following method:
(i) a copper foil having a thickness of 18 μm is provided on (a) both sides of the multilayer polyimide film itself or on (b) both sides of a polyimide film formed as a 12.5 μm-thick single layer film from a polyamic acid solution from which the clad layer is made, (ii) the copper foil and the polyimide film are thermally compressed together at a laminating temperature of 380° C., laminating pressure of 0.8 t, and line speed of 1 m/min, so as to prepare a sample according to JIS C6471 "6.5 Peeling Strength", and (iii) a load for peeling the metal foil part having a width of 5 mm with a peeling angle of 180 degrees at a peeling rate of 50 mm/min is measured.

2. The multilayer polyimide film according to claim 1, wherein:
the average modulus of elasticity (a) of the core layer and the average modulus of elasticity (b) of the clad layers, each in the multilayer polyimide film, satisfy the following relational formulation (2):

$$0.9a \geq b \geq 0.3a \qquad (2).$$

3. The multilayer polyimide film according to claim 1, wherein:
each of the clad layers has a thickness component ratio of not less than 10% but not more than 50% with respect to the multilayer polyimide film as a whole.

4. The multilayer polyimide film according to claim 1, wherein:
the average modulus of elasticity (a) of the core layer in the multilayer polyimide film is not less than 4 GPa but not more than 7 GPa.

5. The multilayer polyimide film according to claim 1, wherein:
the film has an entire thickness in a range of 7 μm to 30 μm.

6. The multilayer polyimide film according to claim 1, being used as a base film of a cover lay or a metal-clad laminate.

7. A laminate comprising:
a multilayer polyimide film as set forth in claim 1; and
an adhesive layer provided on one or each side of the multilayer polyimide film.

8. A metal-clad laminate comprising:
a multilayer polyimide film as set forth in claim 1; and
a metal layer stacked on the multilayer polyimide film.

9. A metal-clad laminate comprising:
a laminate as set forth in claim 7 on which the adhesive layer is provided; and
a metal layer stacked on the laminate.

10. A multilayer polyimide film having a multilayer structure, comprising:
a core layer; and
clad layers provided on each side of the film, the clad layers being exposed,
the polyimide film, after being shaved by 25% of its entire thickness from surface layers on each side of the film in a thickness direction, having an average coefficient of linear expansion at a temperature from 100° C. to 200° C. in a range of 5 ppm/° C. to 20 ppm/° C.,
each of the clad layers having a peeling strength of 3 N/cm or less,
the film as a whole having an average coefficient of linear expansion at a temperature from 100° C. to 200° C. in a range of 9 ppm/° C. to 30 ppm/° C., and $$(a) > (b) \qquad (1),$$

where (a) is an average modulus of elasticity of the core layer and (b) is an average modulus of elasticity of the clad layers;
wherein the peeling strength denotes an adhesion strength determined by the following method:
(i) a copper foil having a thickness of 18 μm is provided on (a) both sides of the multilayer polyimide film itself or on (b) both sides of a polyimide film formed as a 12.5 μm-thick single layer film from a polyamic acid solution from which the clad layer is made, (ii) the copper foil and the polyimide film are thermally compressed together at a laminating temperature of 380° C., laminating pressure of 0.8 t, and line speed of 1 m/min, so as to prepare a sample according to JIS C6471 "6.5 Peeling Strength", and (iii) a load for peeling the metal foil part having a width of 5 mm with a peeling angle of 180 degrees at a peeling rate of 50 mm/min is measured.

* * * * *